United States Patent
Morikuni et al.

(10) Patent No.: US 9,639,008 B2
(45) Date of Patent: May 2, 2017

(54) LITHOGRAPHY APPARATUS, AND ARTICLE MANUFACTURING METHOD

(71) Applicant: CANON KABUSHIKI KAISHA, Tokyo (JP)

(72) Inventors: Yuichiro Morikuni, Utsunomiya (JP); Yoshinori Ohsaki, Utsunomiya (JP); Osamu Morimoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 23 days.

(21) Appl. No.: 14/451,727

(22) Filed: Aug. 5, 2014

(65) Prior Publication Data

US 2015/0042969 A1 Feb. 12, 2015

(30) Foreign Application Priority Data

Aug. 7, 2013 (JP) .................................. 2013-163734

(51) Int. Cl.
G03B 27/52 (2006.01)
G03F 9/00 (2006.01)

(52) U.S. Cl.
CPC .......... G03F 9/7023 (2013.01); G03F 9/7026 (2013.01); G03F 9/7034 (2013.01); G03F 2009/005 (2013.01)

(58) Field of Classification Search
CPC ........................ G03F 2009/005; G03F 9/7023
See application file for complete search history.

(56) References Cited

U.S. PATENT DOCUMENTS

| | | | | |
|---|---|---|---|---|
| 5,151,749 A | * | 9/1992 | Tanimoto | G01B 11/005 250/548 |
| 5,363,196 A | * | 11/1994 | Cameron | G03F 7/70691 356/500 |
| 5,742,067 A | * | 4/1998 | Imai | G03F 7/70358 250/548 |
| 6,813,000 B1 | * | 11/2004 | Nishi | G03F 7/70358 355/53 |
| 6,813,022 B2 | * | 11/2004 | Inoue | G03F 7/70691 356/138 |

(Continued)

FOREIGN PATENT DOCUMENTS

JP 10-163099 A 6/1998

*Primary Examiner* — Deoram Persaud
(74) *Attorney, Agent, or Firm* — Rossi, Kimms & McDowell LLP (57) ABSTRACT

A lithography apparatus includes a measuring station that includes a first measuring device configured to measure a height of a substrate holder, and a second measuring device configured to measure a height of a surface of a substrate held by the holder, and a patterning station that includes a third measuring device configured to measure a height of the holder, and patterns the substrate held by the holder based on an output of the second measuring device. The patterning station includes a fourth measuring device configured to measure a height of a surface of a substrate held by the holder. The lithography apparatus includes a controller configured to obtain a correction value for an output obtained from at least one of the first and third measuring devices based on outputs of the second and fourth measuring devices with respect to a substrate held by the holder.

12 Claims, 8 Drawing Sheets

(56) References Cited

U.S. PATENT DOCUMENTS

| | | | | |
|---|---|---|---|---|
| 6,819,433 B2* | 11/2004 | Takai | .................. | G01B 11/028 356/500 |
| 7,265,364 B2* | 9/2007 | Teunissen | ............. | G03F 9/7034 250/339.01 |
| 8,120,750 B2* | 2/2012 | Hattori | .................. | G03B 27/42 355/53 |
| 2003/0133125 A1* | 7/2003 | Hattori | ................ | G03F 7/70775 356/500 |
| 2005/0138988 A1* | 6/2005 | Levasier | ............ | G03F 7/70516 73/1.81 |
| 2007/0030467 A1* | 2/2007 | Horikawa | ........... | G03F 7/70341 355/53 |
| 2007/0058146 A1* | 3/2007 | Yamaguchi | ......... | G03F 7/70775 355/53 |
| 2007/0263191 A1* | 11/2007 | Shibazaki | ........... | G03F 7/70641 355/53 |
| 2009/0123874 A1* | 5/2009 | Nagayama | .......... | G03F 7/70525 430/311 |
| 2009/0214962 A1* | 8/2009 | Mishima | ................ | G03B 27/44 430/30 |
| 2009/0310106 A1* | 12/2009 | Mishima | ............. | G03F 7/70425 355/52 |
| 2014/0063480 A1* | 3/2014 | Wu | .................... | G03F 7/70725 355/72 |

* cited by examiner

LITHOGRAPHY APPARATUS, AND ARTICLE MANUFACTURING METHOD

BACKGROUND OF THE INVENTION

Field of the Invention

The present invention relates to a lithography apparatus and an article manufacturing method.

Description of the Related Art

An exposure apparatus is an apparatus that exposes a substrate (e.g., a wafer, a glass plate, or the like where a resist layer is formed on the surface thereof) via a pattern of an original (reticle or the like) in a lithography step included in manufacturing steps for a semiconductor device, a liquid crystal display device, and the like. In the exposure apparatus, a very high accuracy is required for focusing and leveling adjustment by a substrate stage with increasing the NA (numerical aperture) of a projection optical system for forming the image of the pattern on a substrate. For example, in the scanning exposure apparatus having an NA of 0.93, the depth of focus which can be ensured during exposure is about 200 [nm]. Here, the accuracy of control which can be allocated to focusing and leveling adjustment is considered. At this time, when error factors such as a field curvature, a defocus amount caused by a reticle, calibration (measurement) of an image plane, and the like are removed from the depth of focus, the accuracy of control is typically about 10% of 200 [nm](about 20 [nm]). Thus, a measuring device that is capable of measuring the distance between the top surface (top plate surface) of a stage and a surface plate on which a projection optical system is secured and includes a laser interferometer exhibiting excellent linearity and high resolution has conventionally been employed for focusing (the Z-axis) and leveling ($\omega x$ and $\omega y$) measurement.

On the other hand, Japanese Patent Laid-Open No. H10-163099 discloses an exposure apparatus that includes a plurality of substrate stages in one apparatus for the purpose of making an improvement in throughput. In the exposure apparatus, for example, two regions, i.e., the first region (exposure station) for performing exposure and the second region (measuring station) for performing measurement (alignment measurement) of a substrate prior to exposure are provided on a surface plate. In accordance with this arrangement, the exposure apparatus can expose the first substrate held by the other substrate stage on the exposure station while the exposure apparatus measures the second substrate held by one substrate stage on the measuring station.

The exposure apparatus disclosed in Japanese Patent Laid-Open No. H10-163099 includes a ZX bar mirror as one of flat mirrors (reference members) for use in measurement by a laser interferometer. The ZX bar mirror is disposed on each of the surface plates (surface plate for supporting a projection optical system or a measuring device) of the exposure station and the measuring station so as to face the substrate stage. Thus, two different ZX bar mirrors are referenced by the exposure station and the measuring station, and a focus error may occur on the exposure station if a relative error between the shapes of two ZX bar mirrors exists. Leveling (in particular, $\omega y$) is also based on measurement values obtained by two different ZX bar mirrors, and thus, a leveling error may occur as in the focus error.

Such a relative error between the shapes of two ZX bar mirrors is classified into an error, which can be corrected prior to operation of the apparatus, caused by processing, assembling, installation, and the like and an error over time which appears after operation of the apparatus. Among them, the former error can be corrected by measuring an error between the shapes of two ZX bar mirrors disposed on two stations and storing a correction value corresponding thereto in a memory. On the other hand, in the latter error, firstly, the X-component of an error between shapes having an order less than two order on the Z-X plane in which the entire ZX bar mirror is shifted in the Z-axis direction or the entire ZX bar mirror is tilted may be corrected by zero-point matching between two stations. Here, the error component between the shapes having an order less than two order refers to the X-component of zero order and first order when $Z=f(X)$. However, for example, the error component between the shapes having an order greater than two order, such as an arcuate error component between shapes, cannot be corrected by zero-point matching. Thus, a change over time of the relative error component between the shapes having an order greater than two order between two ZX bar mirrors provides a reduction in positioning precision, which may result in defocus or the like including blur on one side of a projected image (blur caused by a relative tilt between a substrate surface and an image plane).

SUMMARY OF THE INVENTION

The present invention provides, for example, a lithography apparatus advantageous in terms of positioning precision of a substrate holder.

According to an aspect of the present invention, a lithography apparatus that patterns a substrate is provided that includes a substrate holder configured to hold the substrate and be movable; a measuring station that includes a first measuring device including a first referenced member and configured to measure a height of the substrate holder, and a second measuring device configured to measure a height of a surface of the substrate held by the substrate holder; a patterning station that includes a third measuring device including a second referenced member and configured to measure a height of the substrate holder, and patterns the substrate held by the substrate holder based on an output of the second measuring device; and a controller, wherein the patterning station includes a fourth measuring device configured to measure a height of a surface of a substrate held by the substrate holder, and the controller is configured to obtain a correction value for an output obtained from at least one of the first measuring device and the third measuring device based on an output of the second measuring device and an output of the fourth measuring device with respect to a substrate held by the substrate holder.

Further features of the present invention will become apparent from the following description of exemplary embodiments with reference to the attached drawings.

DESCRIPTION OF THE EMBODIMENTS

Hereinafter, preferred embodiments of the present invention will be described with reference to the drawings.

Figure 1:
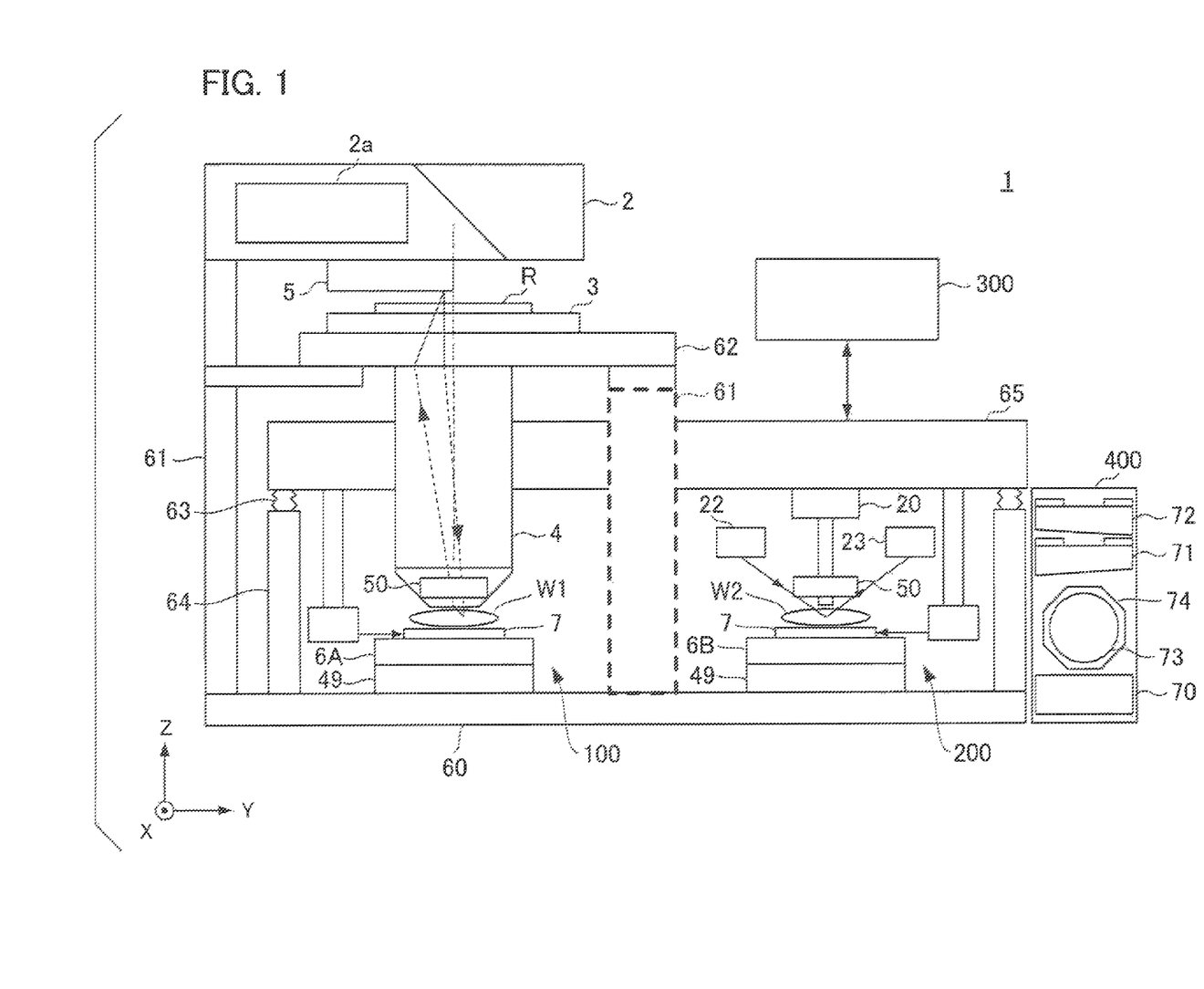
FIG. 1 is a diagram illustrating a configuration of an exposure apparatus according to one embodiment of the present invention.

Firstly, a description will be given of a configuration of a lithography apparatus according to one embodiment of the present invention. The lithography apparatus is an apparatus that patterns a substrate such as a wafer or the like. Hereinafter, a description will be given by taking an example of the lithography apparatus according to the present embodiment as an exposure apparatus. FIG. 1 is a schematic diagram illustrating a configuration of an exposure apparatus 1 according to the present embodiment. In FIG. 1, a description will be given where the Z axis is aligned parallel to the optical axis (in the present embodiment, vertical direction) of a projection optical system 4 to be described below, the Y-axis is aligned in the scanning direction of a wafer W during exposure within a plane perpendicular to the Z-axis, and the X-axis is aligned in the non-scanning direction perpendicular to the Y-axis. As an example, the exposure apparatus 1 is a projection type exposure apparatus that is used in manufacturing steps of a semiconductor device and exposes a pattern formed on a reticle R by a step-and-scan method to the wafer W (substrate). Here, the step-and-scan method refers to a method for scanning an elongated slit-shaped exposure area while synchronizing the reticle R with the wafer W. In order to accommodate the projection optical system 4 having NA of 1.0 or greater, the exposure apparatus 1 is a liquid immersion type exposure apparatus in which a liquid such as pure water is locally filled between the wafer W and the final lens of the projection optical system 4. Note that a feeding nozzle for feeding a liquid on the wafer W, an exhaust nozzle for exhausting a liquid after exposure, and the like are not illustrated in FIG. 1. Furthermore, the exposure apparatus 1 includes a wafer stage 6 having a plurality of stages for holding the wafer W in the apparatus. In particular, in the present embodiment, the exposure apparatus 1 is so-called a twin-stage type exposure apparatus including, for example, two wafer stages 6. Firstly, the exposure apparatus 1 includes an exposure station 100, a measuring station 200, a controller 300, and a wafer transfer system 400.

The exposure station (patterning station) 100 includes an illumination system 2, a reticle stage 3, a projection optical system 4, and a first focus position measuring unit 5. The illumination system 2 shapes light emitted from a light source 2a into a predetermined beam shape, and then irradiates the reticle R held by the reticle stage 3 with the shaped light. The light source 2a outputs light of a plurality of wavelength bands, e.g., light such as a mercury lamp, an ArF excimer laser, a KrF excimer laser, or the like, as exposure light. The reticle R is, for example, an original made of glass on which a fine circuit pattern is formed. The projection optical system (projection system) 4 reduces the image of the circuit pattern formed on the reticle R by a predetermined reduction magnification, and then projects the reduced image onto a shot set on the wafer W.

Figure 2:
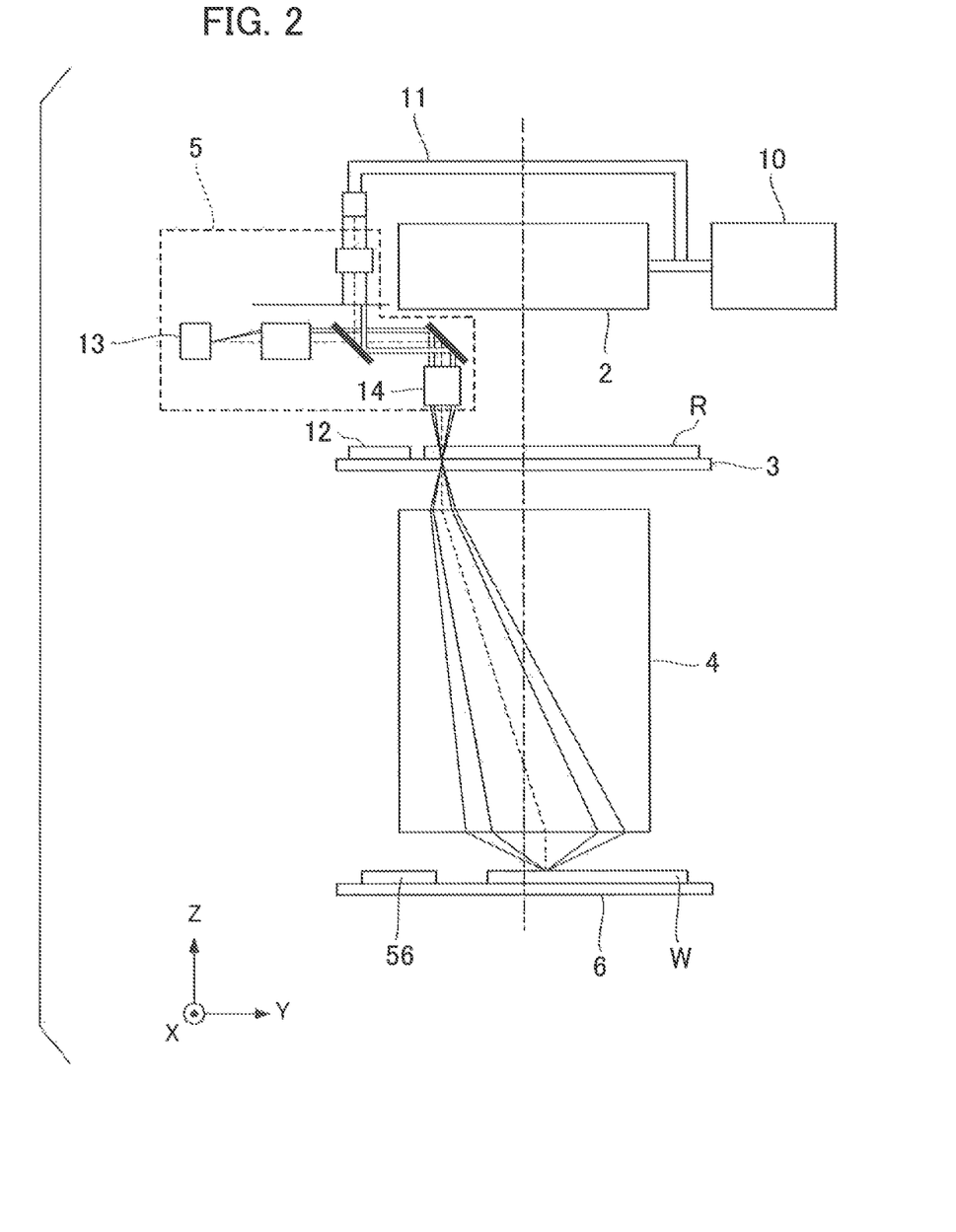
FIG. 2 is a diagram illustrating a configuration of a first focus position measuring unit.

FIG. 2 is a schematic diagram illustrating a configuration of the first focus position measuring unit 5 and its measurement principle. The first focus position measuring unit (fourth measuring device) 5 may be, for example, a TTL (Through The Lens) type image detecting system as shown in FIG. 2. A light beam emitted from a light source 10 is incident on the illumination system 2 for exposure, and then is split into exposure light and non-exposure light. Among the split light beams, the non-exposure light is guided to the illumination system of the first focus position measuring unit 5 via a routing system 11 constituted by an optical fiber, a lens, a mirror, and the like. The light beam emitted from the illumination system is restricted by the aperture stop plane of the projection optical system 4, i.e., an aperture stop for causing light to be incident obliquely on the reference plate 12 provided at a position substantially conjugate with a pupil plane. The aperture stop for causing light to be incident obliquely on the reference plate 12 has a slit-shaped aperture at a position shifted in the Y-axis direction from the optical axis, and the measurement light passed through an object lens is grazingly incident on a surface position measurement mark at the angle of incidence. Note that the surface position measurement mark is formed on a reticle reference plate 12 and includes a portion through which measurement light is transmitted and a portion from which measurement light is reflected (shielded). Light (wafer-reflected light) transmitted through the surface position measurement mark passes through the projection optical system 4, is incident on the wafer W placed on the wafer stage 6, reflected from the wafer W, passes through the projection optical system 4 again, and then is received by an imaging element 13. On the other hand, light (reticle-reflected light) reflected from the surface position measurement mark passes through an object lens 14 and then is received by the imaging element 13. In this manner, the reticle-reflected light and the wafer-reflected light are imaged in a line pattern on the imaging element 13. The line pattern of the reticle-reflected light does not coincide with that of the wafer-reflected light, but the line patterns deviate from each other by ΔY. The deviation amount ΔY is a value that is dependent on the shift amount of the aperture on the aperture stop for causing light to be incident obliquely on the reference plate 12 and the drive amount of the wafer stage 6 in the Z-axis direction. Since the shift amount of the aperture is constant in the present embodiment, it is contemplated that the deviation amount ΔY is a value that is only dependent on the drive amount of the wafer stage 6 in the Z-axis direction. While the wafer stage 6 is scanning or step-driving in the Y-axis direction, the first focus position measuring unit 5 illuminates the surface position measurement mark and images the reticle-reflected light and the wafer-reflected light at predetermined intervals. The surface of the wafer W is not a perfect plane but has unevenness. Thus, the surface position of the wafer W at the measurement point of the first focus position measuring unit 5 minimally varies by the amount of ΔZ in the Z-axis direction depending on the unevenness. The minimal, variation ΔZ is detected as a minimal shift ΔYd of the wafer-reflected light on the detection surface of the imaging element 13. At this time, the reticle stage 3 is not driven (moved), and thus, there is no shift in the reticle-reflected light on the detection surface of the imaging element 13. Thus, the first focus position measuring unit 5 can specify the minimal shift ΔYd with reference to the reticle-reflected light, so that the minimal variation ΔZ can be specified from the minimal shift ΔYd. Then, the first focus position measuring unit 5 can measure a focus position by the movement of the wafer stage 6 in the focus direction (the Z-axis) and in the leveling direction (in particular, ωy direction) in accordance with the displacement of the surface position of the wafer W based on the minimal variation ΔZ.

The measuring station 200 includes an off-axis scope (OAS) 20 and a second focus position measuring unit 21. The OAS 20 detects an alignment mark so as to measure a positional offset amount in the X-axis and Y-axis directions on the measurement axis. More specifically, the OAS 20 measures the relative position and the posture relationship between an alignment mark on the wafer W placed on the wafer stage 6 and a reference mark 55 on the wafer stage 6 (fine movement stage 41) to be described below while the OAS 20 is moving with respect to the design coordinate value of the wafer stage 6.

Figure 3:
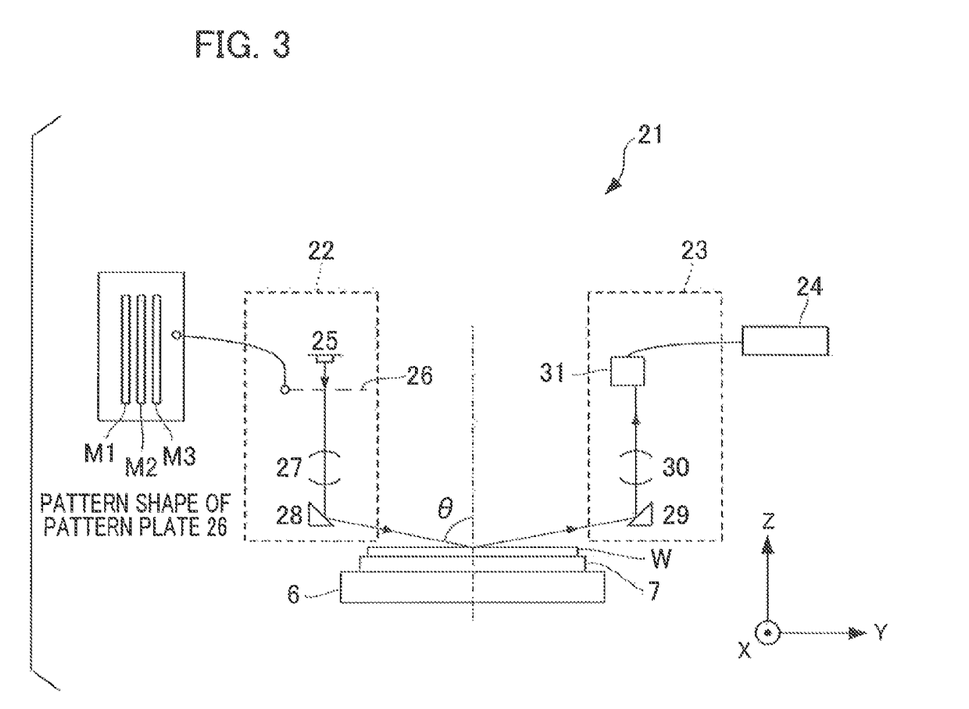
FIG. 3 is a diagram illustrating a configuration of a second focus position measuring unit.

FIG. 3 is a schematic diagram illustrating a configuration of the second focus position measuring unit 21 and its measurement principle. The second focus position measuring unit (second measuring device) 21 may measure the surface shape (focus map information about the entire surface) of the wafer W by measuring the focus positions at plural positions on the surface of the wafer W. The second focus position measuring unit 21 includes a light projecting system 22 that projects, for example, a plurality of light beams onto the wafer W at a high angle of incidence (angle θ), a light receiving system 23 that receives light reflected from the wafer W, and a signal processing unit 24. The light projecting system 22 includes a light source 25, a pattern plate 26, an imaging lens 27, and a mirror 28. In the example shown in FIG. 3, lenses for illuminating the pattern plate 26 with a uniform illuminance distribution, lenses for correcting chromatic aberration, and the like are not illustrated. The light source 25 is an LED, a halogen lamp, or the like that illuminates the pattern plate 26 with light having a wavelength λ1. The pattern plate 26 has a light shielding portion in which three rectangular (of which the longitudinal direction is the X-axis direction) slit patterns M1, M2, and M3 are formed. Light passed through the slit patterns M1, M2, and M3 are projected and imaged on the wafer W via the imaging lens 27 and the mirror 28. On the other hand, the light receiving system 23 includes a mirror 29, a lens 30, and a two-dimensional imaging element 31. Light (pattern image) reflected from the wafer W is received (re-imaged) by the two-dimensional imaging element 31 (e.g., CMOS sensor) via the mirror 29 and the lens 30. Here, when the wafer W is moved in the vertical direction (the Z-axis direction) under the drive of the wafer stage 6, the pattern image of the pattern plate 26 is moved in the Y-axis direction on the imaging plane of the two-dimensional imaging element 31. Thus, the second focus position measuring unit 21 causes the signal processing unit 24 to derive the position of the pattern image, so that the second focus position measuring unit 21 can detect the surface position of the wafer W for each measurement point. The displacement amount Y of each spot on the imaging plane of the two-dimensional imaging element 31 with respect to the displacement Z of the surface position of the wafer W in the Z-axis direction is represented by the formula: $Y=(2M \sin \theta) \times Z$, where the optical magnification of the light receiving system 23 is M and the angle of incidence on the wafer W is θ. In other words, the displacement Z is represented by the formula: $Z=Y/(2M \sin \theta)$. Then, the second focus position measuring unit 21 can measure a focus position by the movement of the wafer stage 6 in the focus direction and in the leveling direction in accordance with the displacement of the surface position of the wafer W based on the displacement Z.

Although the first focus position measuring unit 5 and the second focus position measuring unit 21 are not illustrated in FIG. 3, the first focus position measuring unit 5 and the second focus position measuring unit 21 are aligned in plural in the X-axis direction in the exemplary arrangement shown in FIG. 1. This is for the purpose of obtaining the measurement result in the focus direction and in the leveling direction (tilt of the surface horizontally relative to the Z-axis direction because the measurement result can only be obtained in the focus direction if only one focus position measuring unit 5 is provided on the station 100 and only one focus position measuring unit 21 is provided on the station 200. In this case, it is preferable that the attachment intervals (array intervals) of the first focus position measuring units 5 and the second focus position measuring units 21 in the X-axis direction are equal in order to set the measurement image heights of the first focus position measuring units 5 and the second focus position measuring units 21 to the same coordinates. In the above configuration, it is desirable to perform focus measurement by the first focus position measuring unit 5 and focus measurement by the second focus position measuring unit 21 while scanning the wafer stage 6 from the viewpoint of reduction in time required for measuring focus map information.

The wafer stage (substrate holder) 6 is movable while holding the wafer W by suction via a chuck 7. In particular, the twin-stage type exposure apparatus 1 is illustrated in the present embodiment. In this case, there are two wafer stages 6 (a first wafer stage (first substrate holder) 6A and a second wafer stage (second substrate holder) 6B). Each of these wafer stages 6 is movable (the position thereof is alternatively switchable) between the exposure position on the exposure station 100 and the alignment measurement position on the measuring station 200. The wafer stages 6 enable to perform exposure for a first wafer (first substrate) W1 placed on the first wafer stage 6A at the exposure station 100 and measurement for a second wafer (second substrate) W2 placed on the second wafer stage 6B at the measuring station 200 in parallel.

Figure 4:
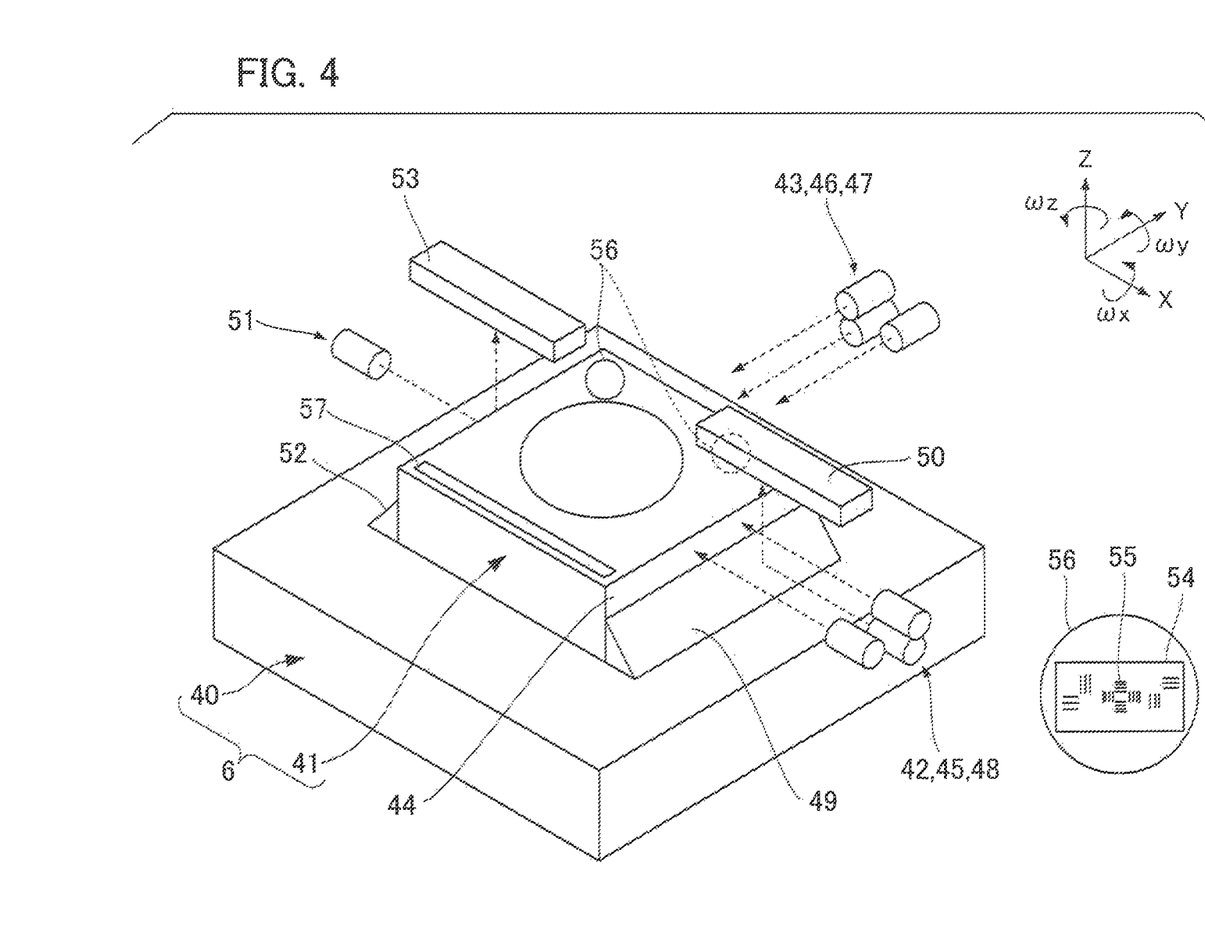
FIG. 4 is a diagram illustrating the arrangement of a wafer stage position measuring system.

FIG. 4 is a schematic perspective view illustrating a configuration of the wafer stage 6 and a position measuring system (hereinafter referred to as "length measuring mechanism" because it specifies the positions of two wafer stages 6 by measuring the distance therebetween) for measuring the positions of two wafer stages 6 disposed on the stations 100 and 200, respectively. The configuration of the first wafer stage 6A is the same as that of the second wafer stage 6B. The wafer stage 6 includes a coarse movement stage 40 that is movable in the X-Y plane, and a fine movement stage 41 that is mounted on the coarse movement stage 40, disposes the chuck 7 (not shown in FIG. 4) for directly holding the wafer W, and is movable about six axes for tilt correction about the Z-axis in the ωz direction.

Firstly, the position of the fine movement stage 41 in the X-axis and Y-axis directions is measured by an interferometer (X-interferometer) 42 for X-axis direction position measurement and an interferometer (Y-interferometer) 43 for Y-axis direction position measurement which are laser interferometers serving as length measuring mechanisms. The X-interferometer 42 irradiates an X bar mirror (flat mirror) 44 which is extended to the side surface of the fine movement stage 41 in the Y-axis direction with a laser beam and then detects the laser beam reflected from the X bar mirror 44 so as to measure the position of the fine movement stage 41 in the X-axis direction. On the other hand, the Y-interferometer 43 irradiates a Y bar mirror (not shown) which is extended to the side surface of the fine movement stage 41 in the X-axis direction with a laser beam and then detects the laser beam reflected from the Y bar mirror so as to measure the position of the fine movement stage 41 in the Y-axis direction. An interferometer (X yaw interferometer) 44 for X-axis yaw direction position measurement and an interferometer (Y yaw interferometer) 45 for Y-axis yaw direction position measurement which are laser interferometers are disposed so as to be spaced from each other in the horizontal direction on both the X-axis and Y-axis sides or either one of the X-axis side and the Y-axis side in accordance with the X-interferometer 42 and the Y-interferometer 43. The displacement amount ωz of the fine movement stage 41 in the rotational direction within the X-Y plane is measured by the X yaw interferometer 44 and the Y yaw interferometer 45. The rotation ωx of the fine movement stage 41 about the X-axis is measured by a tilt interferometer 47 which is a laser interferometer which is disposed in spaced relationship to the Y-interferometer 43 with the spacing Δz in the vertical direction and is arranged side-by-side to the Y-interferometer 43 in the horizontal direction without any positional displacement therebetween.

Furthermore, the position of the fine movement stage 41 in the Z-axis direction is measured by a first interferometer (first Z-interferometer) 48 for Z-axis direction position measurement and a second interferometer (second Z-interferometer) 51 for Z-axis direction position measurement which are laser interferometers serving as length measuring mechanisms. For a group of these two interferometers, one interferometer provided on the measuring station 200 side and the other interferometer provided on the exposure station 100 side may also be regarded as the first measuring device and the third measuring device, respectively, in contrast to the already-mentioned second measuring device and fourth measuring device. Among them, the first Z-interferometer 48 is an interferometer disposed on the X-interferometer 42 side. A laser beam emitted from the first Z-interferometer 48 is reflected from a ZY bar mirror 49 which is extended to the side surface of the fine movement stage 41 in the Y-axis direction such that the traveling direction of the reflected laser beam is changed in +Z direction (upward in the Z-axis direction). The laser of which the traveling direction is changed is reflected from a ZX bar mirror (flat mirror serving as a reference member) 50 disposed on a barrel surface plate 65 (see FIG. 1) toward −Z direction (downward in the Z-axis direction), and then returns again to the first Z-interferometer 48. Here, the component in the focus direction obtained by the first Z-interferometer 48 is ZR. Likewise, the second Z-interferometer 51, the ZY bar mirror 52, and a ZX bar mirror (flat mirror serving as a reference member) 53 are disposed on the opposite side of the first Z-interferometer 48 with reference to the fine movement stage 41. Here, the component in the focus direction obtained by the second Z-interferometer 51 is ZL. Note that the ZX bar mirrors 50 and 53 provided on the measuring station 200 side may be collectively regarded as the first reference member, whereas the ZX bar mirrors 50 and 53 provided on the exposure station 100 side may be collectively regarded as the second reference member. Thus, the positions of the fine movement stage 41 in the Z-axis direction on the entire surface of the X-Y plane are measured by using two Z interferometers 48 and 51 and then are averaged so that the position $Z_{pos}$ of the fine movement stage 41 in the Z-axis direction can be measured with precision. In this case, the position $Z_{pos}$ may be calculated from the relationship: $Z_{pos}=(ZL+ZR)/2$. The component $\omega y_{pos}$ in the ωy direction may also be calculated from the relationship: $\omega y_{pos}=(ZL-ZR)/L$ by taking the difference between ZL and ZR. It should be noted that the symbol L denotes the distance between a point at which a laser beam impinges on the ZY bar mirror 49 and a point at which a laser beam impinges on the ZY bar mirror 52 in the X-axis direction.

The fine movement stage 41 also has two LIPS sensors 54 which are arranged in spaced relationship to each other in the X-axis direction and two sensor units 56 each having the reference mark 55 on the surface (on the stage top plate) thereof. In the exposure apparatus 1, after the wafer stage 6 has travelled between the stations, an alignment operation is performed by passing exposure irradiation light through the LIPS mark (not shown) rendered in advance on the reticle R as a reticle design and the LIPS sensors 54. Offset displacement in the focus and leveling directions is corrected by the alignment operation. Hereinafter, a detailed description will be given of the correction principle. Focus map information about the wafer W (first wafer W1) on, for example, the first wafer stage 6A, which has been measured by the measuring station 200, is stored as a difference value between the Z and ωy components relative to the reference plane of the LIPS sensors 54. The first wafer stage 6A which has completed the acquisition of focus map information about the first wafer W1 and XY alignment measurement is replaced with the second wafer stage 6B on the exposure station 100 side and is sent to the exposure station 100 (at the exposure position below the projection optical system 4). Next, aerial image measurement for the LIPS mark is performed between the LIPS mark on the reticle R and two LIPS sensors 54 on the first wafer stage 6A, and thus, zero-point alignment is performed for the X-, Y-, Z-, ωz-, and ωy-axial components on the first wafer stage 6A. Next, the reticle R is positioned at a desired shot position based on the exposure sequences defined in advance as a recipe, the shot array, the alignment measurement result obtained by the measuring station 200, and focus map information. Furthermore, offset displacement in the focus and leveling directions are corrected based on these pieces of information to thereby perform exposure.

The controller 300 may execute operation control of various measuring units and the driving unit included in the exposure apparatus 1, calculation processing for a stage target trajectory during exposure by processing focus map information and the alignment measurement result, and the like. The controller 300 is constituted, for example, by a computer or the like and is connected to the components of the exposure apparatus 1 via a line to thereby execute control of the components in accordance with a program or the like. Note that the controller 300 may be integrated with the rest of the exposure apparatus 1 (provided in a shared housing) or may also be provided separately from the rest of the exposure apparatus 1 (provided in a separate housing).

Among the above components, the illumination system 2 and a reticle stage base surface plate 62 for supporting the reticle stage 3 are supported by supports 61 which are extended from a base surface plate 60 placed on the floor toward the Z-axis direction. The reticle stage base surface plate 62 receives the load of the reticle R, and the reaction force caused by the driving of the reticle R is cancelled out by the driving of a counter mass (not shown). The projection optical system 4 is supported by the barrel surface plate 65 which is supported by the base surface plate 60 via a support pillar 64 while being vibrationally isolated by a damper (vibration-damping member) 63. Various laser interferometers and the ZX bar mirrors 50 and 53, which serve as the position measuring system for measuring the position of the wafer stage 6 described with reference to FIG. 4, are also supported by the barrel surface plate 65. The wafer stage 6 is supported by a wafer stage surface plate (not shown) laid on the base surface plate 60, and is travelled between the stations on the wafer stage surface plate.

The wafer transfer system 400 to which the FOUP 70 for housing the wafers W to be processed can be mounted includes a first hand 71 for mounting the wafer W from the FOUP 70 onto the wafer stage 6 placed on the measuring station 200 and a second hand 72 for collecting the wafer W. Since the exposure apparatus 1 is a liquid immersion type exposure apparatus, the wafer transfer system 400 incorporates a lid wafer 73 provided such that a liquid film can be maintained in the exposure station 100 even if the wafer W is not fed on the wafer stage 6, and a maintenance carrier 74 for housing the lid wafer 73.

Here, no occurrence of deformation of the shape of the ZX bar mirrors 50 and 53 included in the length measuring mechanism is a precondition for the alignment of the wafer stage 6 in the focus and leveling directions described with reference to FIG. 4. However, the ZX bar mirrors 50 and 53 are correlated to a change over time or a change in environmental temperature, and thus, are minutely deformed. Such deformation may cause a difference between a measurement value obtained by various laser interferometers on the exposure station 100 side and a measurement value obtained by various laser interferometers on the measuring station 200 side. This may result in a difference in alignment in the focus and leveling directions, and the difference may cause defocus and blur on one side of the exposure result. Thus, in the present embodiment, the movement error of the wafer stage 6 caused by a change (relative error between shapes) in shape of the ZX bar mirrors 50 and 53 provided on the stations 100 and 200 is corrected as follows so as to realize the performance assurance and the self-correcting function of the exposure apparatus 1.

Next, a description will be given of the effect (exposure method) of correcting the movement error of the wafer stage 6 due to a change in shape of the ZX bar mirrors 50 and 53 in the exposure apparatus 1. Firstly, prior to a specific description of a correcting step, a description will be given of an exemplary arrangement of the measurement points MP on the wafer W to be measured (same target locations) by the first focus position measuring unit 5 and the second focus position measuring unit 21.

FIGS. 5A to 5E are plan views illustrating the measurement points MP at which focus set on the wafer W is measured. The relative error between shapes of the ZX bar mirrors 50 and 53 may occur when the wafer stage 6 is moved in the X-axis direction. This is because the positions at which laser beams emitted from the first Z-interferometer 48 and the second Z-interferometer 51 are reflected from the ZX bar mirrors 50 and 53, respectively, are shifted in the X-axis direction with movement of the wafer stage 6. When the wafer stage 6 is moved in the Y-axis direction, a laser beam emitted from each of the first Z-interferometer 48 and the second Z-interferometer 51 is reflected at a point from each of the ZX bar mirrors 50 and 53, so that the shapes of the ZX bar mirrors 50 and 53 do not affect on a measurement value. Thus, all the measurement points MP are aligned in the X-axis direction in the following five examples shown in FIGS. 5A to 5E.

Figure 5:
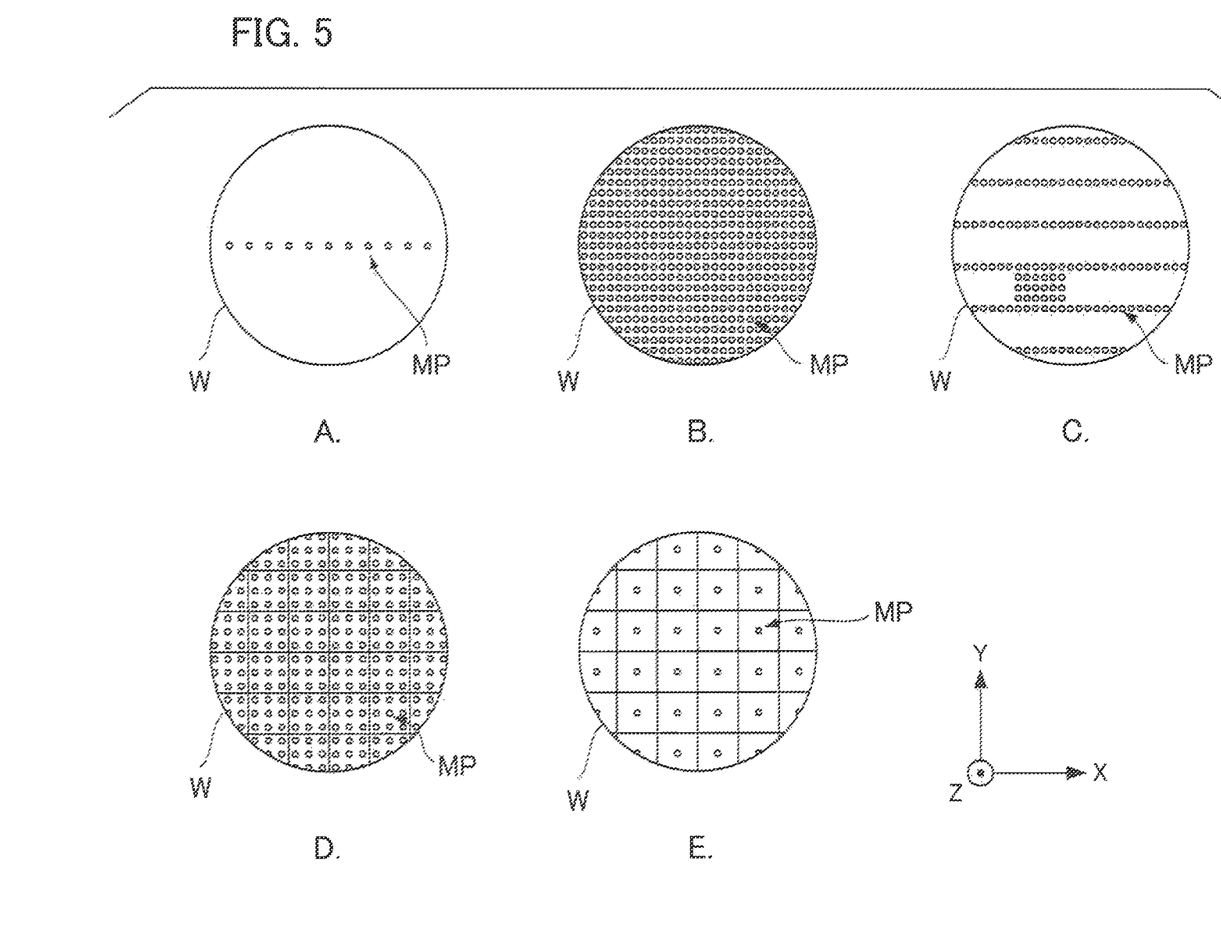
FIG. 5A is a diagram illustrating exemplary measurement points for focus set on a wafer.
FIG. 5B is a diagram illustrating exemplary measurement points for focus set on a wafer.
FIG. 5C is a diagram illustrating exemplary measurement points for focus set on a wafer.
FIG. 5D is a diagram illustrating exemplary measurement points for focus set on a wafer.
FIG. 5E is a diagram illustrating exemplary measurement points for focus set on a wafer.

FIG. 5A is a diagram illustrating the measurement points MP arranged in straight line alignment which passes through the central point on the surface of the wafer W. When an error between the shapes of the ZX bar mirrors 50 and 53 wants to be measured, the wafer stage 6 is moved in the X-axis direction, and thus, the array of the measurement points MP is simplified as described above. The array of the measurement points MP enables distance measurement as much as possible in the X-axis direction. Note that only one-time measurement for one row of a measurement point group may be affected by a measurement error caused by the first focus position measuring unit 5 and the second focus position measuring unit 21. Thus, measurement may be performed in plural times on the same wafer W or measurement may be performed in plural times on the same measurement point MP so as to reduce a measurement error by reducing the standard deviation of the measurement result with statistically increased accuracy.

FIG. 5B is a diagram illustrating the measurement points MP arranged in equi-spaced relation on the entire surface of the wafer W. The array of the measurement points MP enables measurement on the entire surface of the wafer W, and thus, a measurement error can be reduced by the averaging effect more as compared with an exemplary arrangement shown in FIG. 5A. Note that measurement intervals at this time may be changed as appropriate depending on the conditions required at this point. For example, although fine information can be obtained by shortening the measurement intervals, coarse information can only be obtained by lengthening the measurement intervals, which is advantageous for reducing a measurement time.

FIG. 5C is a diagram illustrating many measurement points MP arranged at a specific position on the surface of the wafer W. Such an array is applicable only when it is known in advance that the specific portions of the ZX bar mirrors 50 and 53 are deformed due to a change over time, a change caused by thermal expansion, or the like. In accordance with the array of the measurement points MP, alignment of the wafer stage 6 to a specific position is performed many times by shortening the measurement intervals for measuring the specific position. Since the shapes of the ZX bar mirrors 50 and 53 are referenced each time the alignment is attempted, the state of deformation of the specific portion is observed in detail. The measurement intervals for measurement points other than those at the specific position may be lengthened as compared with an exemplary arrangement shown in FIG. 5B based on the assumption that the ZX bar mirrors 50 and 53 exhibit little deformation. If the assumption can be made that the shapes of the ZX bar mirrors 50 and 53 do not substantially change at the measurement points other than those at the specific position, the measurement points other than those at the specific position may be eliminated. In other words, in the exemplary arrangement shown in FIG. 5C, the measurement intervals of the ZX bar mirrors 50 and 53 are nonuniform by changing the measurement intervals for focus measurement on the wafer W as appropriate so as to reduce a measurement time.

Here, when the exemplary arrangements shown in FIGS. 5A to 5C are applied, any measurement point MP on the surface of the wafer W is measured during measurement, and thus, it is preferable that a bare silicon wafer exhibiting little unevenness in a base pattern or the like is used as the wafer W to be measured. It is preferable that no pattern is developed on the wafer W when the measurement points MP are measured. In the periodic maintenance, the lid wafer 73 accommodated in the maintenance carrier 74 in the wafer transfer system 400 may also be used as a bare silicon wafer.

FIG. 5D and FIG. 5E are diagrams illustrating the measurement points MP arranged in accordance with the shot array preset on the wafer W based on the assumption that the wafer W to be measured is not a bare silicon wafer but a process wafer to be actually processed. In particular, nine measurement points MP are disposed in one shot in the exemplary arrangement shown in FIG. 5D, whereas one measurement point MP is disposed in one shot in the exemplary arrangement shown in FIG. 5E. As described above, alignment of the wafer stage 6 in the focus and leveling directions is performed based on measurement at the relatively same position in the shot array for each shot. If such measurement is not performed, a measurement value may be undesirably changed due to the influence of unevenness of a circuit pattern already developed on the surface of the wafer W. The adverse effect of unevenness of a circuit pattern can be suppressed by these arrays.

While, in the exemplary arrangements shown in FIGS. 5A to 5E, the measurement points MP are set on the surface of the wafer W, the measurement point(s) may be formed outside of the wafer W. For example, a mirror surface member 57 disposed on the surface (on the stage top plate) of the fine movement stage 41 is illustrated in FIG. 4. The mirror surface member 57 is a substitute for the wafer W to be measured in this case. The use of the mirror surface member 57 is advantageous for knowing a change in shape of the ZX bar mirrors 50 and 53 at portions which have not been able to be measured by the measurement points MP set on the surface of the wafer W.

Figure 6:
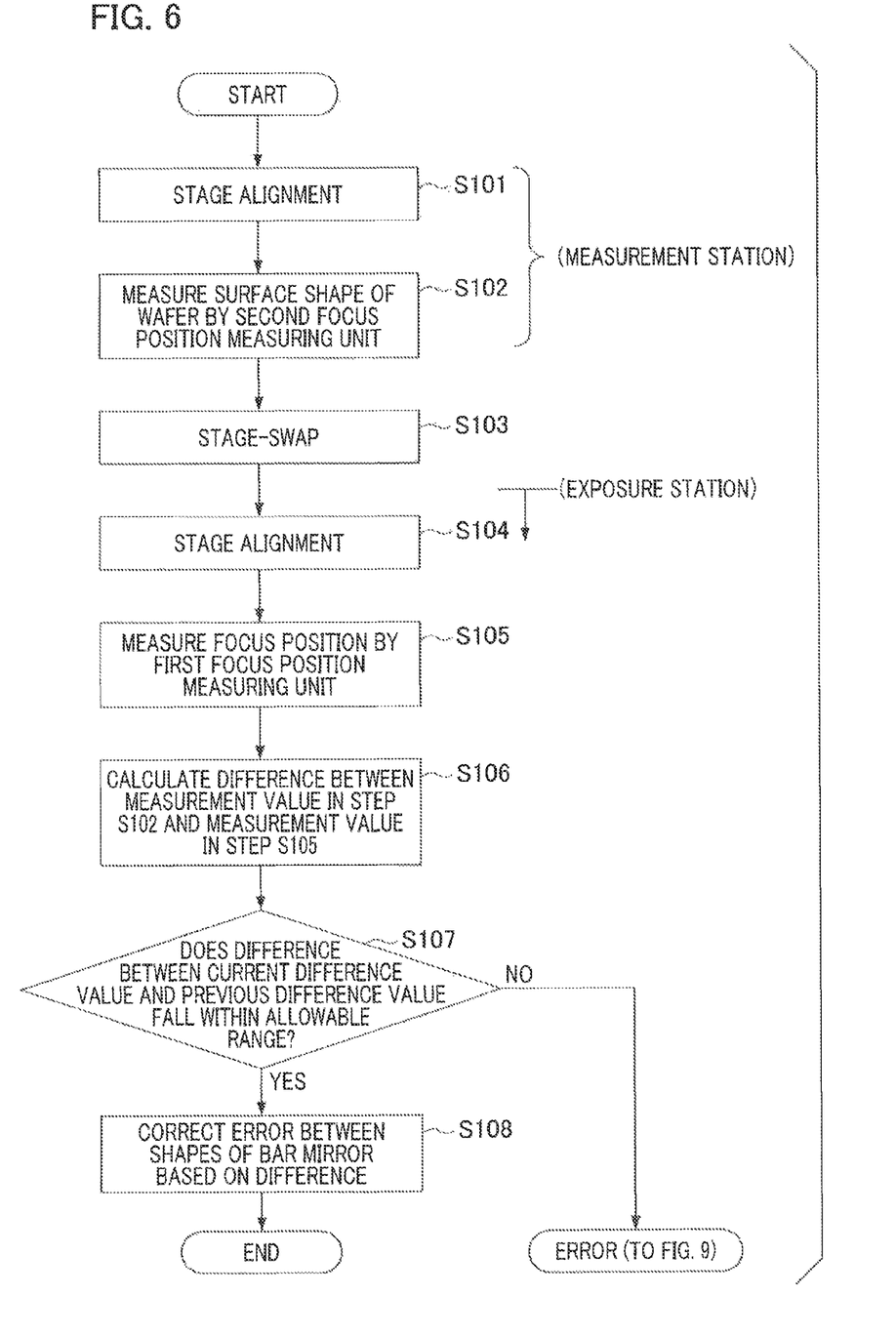
FIG. 6 is a flowchart illustrating a correcting step of correcting an error between the shapes of bar mirrors.

FIG. 6 is a flowchart illustrating a correcting step of correcting a change (error between shapes) in shape (flatness) of the ZX bar mirrors 50 and 53 included in the length measuring mechanism according to the present embodiment. Here, the correcting step needs to be independently performed for the wafer stages 6A and 6B, but a series of flowchart steps shown in FIG. 6 is performed for one wafer stage 6. The correcting step is performed each time a predetermined number (specified number) of wafers W is processed or a predetermined time (specified time) elapses. It should be noted that the timing at which the correcting step is performed is not limited thereto but the correcting step may be performed at the timing immediately after the power is turned on or may also be automatically performed when the exposure apparatus 1 is in the idle state or the like. Furthermore, when the correcting step is performed each time a specified number of wafers W is processed or a specified time elapses, the correcting step may be performed by the other wafer stage 6 while the wafer W to be processed is exposed by one wafer stage 6.

Firstly, the controller 300 causes the measuring station 200 to perform zero point alignment (stage alignment) of the wafer stage 6 (step S101). More specifically, the controller 300 causes the OAS 20 to detect two reference marks 55 on the wafer stage 6 (e.g., the first wafer stage 6A, and so forth), and then adjusts the position of the wafer stage 6 based on the detection result such that X, Y, Z, ωx, and ωy are origin values.

Next, the controller 300 causes the measuring station 200 to measure the surface shape of the wafer W so as to acquire focus map information (second position as focus position measurement information) (step S102). More specifically, the controller 300 causes the second focus position measuring unit 21 to perform focus measurement (and leveling measurement) for the measurement point MP while moving the first wafer stage 6A in the X-axis and Y-axis directions with the target value for the focus leveling axis held to a constant value. Here, focus position measurement information obtained by the second focus position measuring unit 21 is converted to a displacement amount in the Z- and ωy-axes relative to the reference mark 55 for each X-Y position on the wafer W and then is stored in the controller 300.

Next, the controller 300 causes the first wafer stage 6A to move (stage-swap) from the measuring station 200 to the exposure station 100 (step 3103). Since the wafer W on the first wafer stage 6A is held by suction by the chuck 7, there is no deviation in the relative positional relationship between the reference mark 55 (and the LIPS sensors 54) and the wafer W upon stage-swap.

Next, the controller 300 causes the exposure station 100 to perform stage alignment (step S104). The stage alignment is performed with reference to the relative positional relationship between the LIPS mark and the LIPS sensors 54, which is obtained by detecting the image formed by irradiation of exposure irradiation light onto the LIPS mark placed on the reticle R by the LIPS sensors 54 on the first wafer stage 6A.

Next, in the exposure station 100, the controller 300 causes the first focus position measuring unit 5 to measure the position (first position as focus position measurement information) of the surface position of the wafer W in the optical axis direction (step S105). The X-coordinate and Y-coordinate of the measurement point MP at this time are the coordinate positions within the same wafer W to which focus position measurement by the second focus position measuring unit 21 has been performed in step S102.

Next, the controller 300 calculates a difference in the focus direction (and leveling direction) based on the focus position measurement information obtained in step S102 and the focus position measurement information obtained in step S105 (step S106). The difference calculated herein is a relative error between each shapes of the ZX bar mirrors 50 and 53 on the exposure station 100 side and each of the ZX bar mirrors 50 and 53 on the measuring station 200 side and is referred to as a correction amount (correction value) hereinbelow. When no error between shapes occurs, the difference is zero. On the other hand, the first order component and the shift component of each of the ZX bar mirrors 50 and 53 have already been corrected by stage alignment in the stations in step S101 and step S104. Thus, the occurrence of a difference herein may be considered the occurrence of a high-order (second order component or greater) error between shapes. Note that a difference value is not necessarily calculated by measuring the same measurement point MP but may also be calculated by replacing the measurement point MP with an interpolation point obtained by generating a curved surface using a spline function from the measurement points MP.

Figure 7:
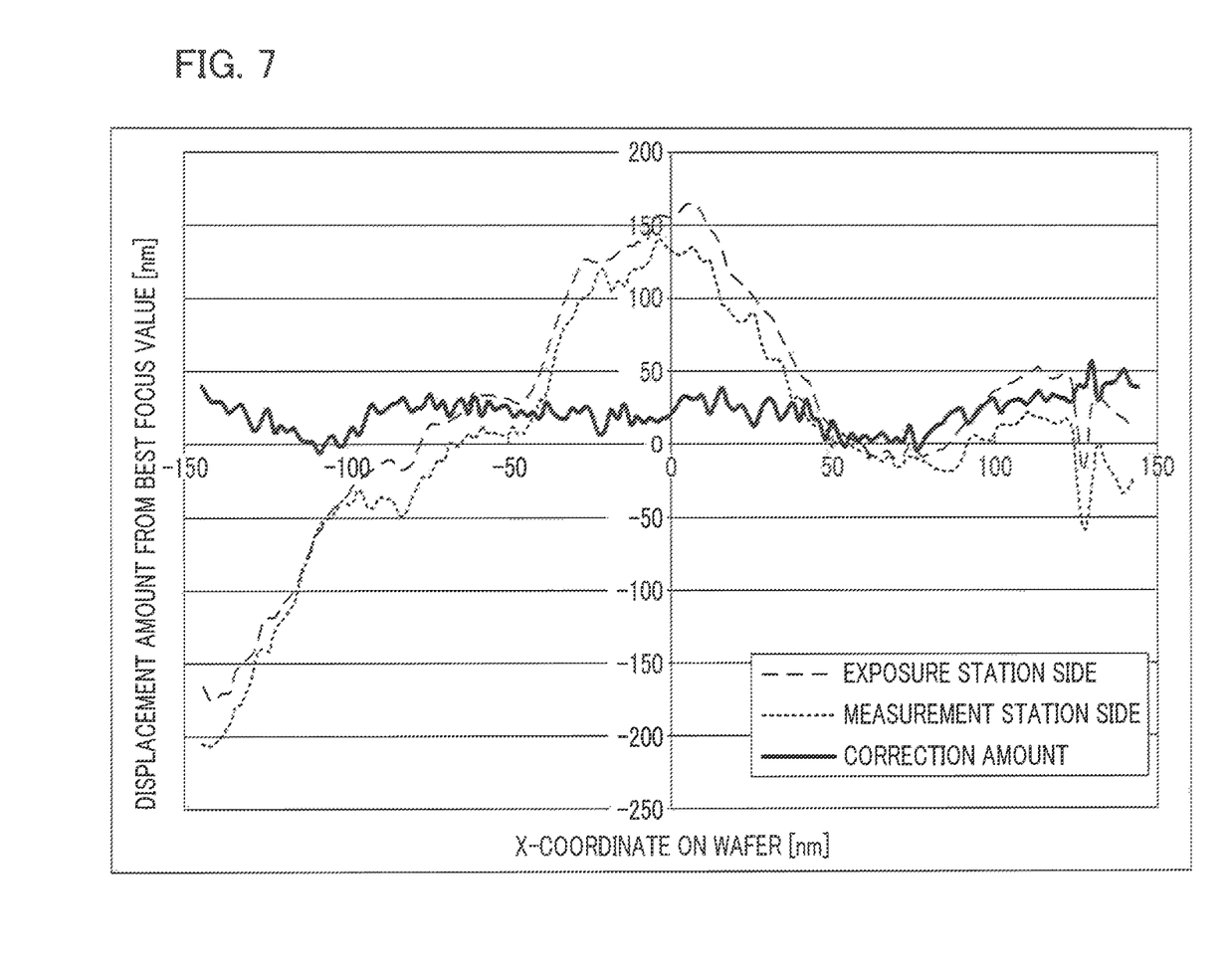
FIG. 7 is a graph illustrating the measurement result obtained by the respective focus position measuring units and the difference therebetween.

FIG. 7 is a graph illustrating the measurement results on the exposure station 100 side (measurement in step S105) and on the measuring station 200 side (measurement in step S102) and a difference (correction amount) determined from these results. In FIG. 7, the measurement points MP are spaced 2 mm from each other in the X-axis and the Y-axis, and the position where Y=0 in the coordinate system in which the center of the wafer W is (0, 0) is extracted. In other words, the horizontal axis is the X coordinate (nm) on the wafer W and the vertical axis is a displacement amount (nm) from a best focus value on the Y-axis.

Next, the controller 300 determines whether or not a difference between the difference (current difference value) determined in step S106 and the difference (previous difference value) determined in the previous correcting step falls within an allowable range of a change in shape over time (step S107). Here, when the controller 300 determines that the difference falls within an allowable range (YES), the process shifts to step S108 to be described below. On the other hand, when the controller 300 determines that the difference does not fall within an allowable range (NO), the process shifts to the following error processing step shown in FIG. 7.

Next, the controller 300 corrects a high-order error between shapes determined based on the difference in step S106 using a correction parameter or a correction table (to be described below) (step S108). At this time, focus position measurement information measured on the exposure station 100 side and on the measuring station 200 side includes an error between shapes of the ZX bar mirrors 50 and 53. In contrast, the absolute shape (individual shape itself) of the ZX bar mirrors 50 and 53 on the exposure station 100 side are calibrated in advance based on the exposure result of a test pattern for focus leveling performance measurement. Hence, error correction between shapes herein refers to matching the shapes of the ZX bar mirrors 50 and 53 on the measuring station 200 side with the shapes of the already-calibrated ZX bar mirrors 50 and 53 on the exposure station 100 side.

As the first correcting method for correcting a specific error between shapes in step S108, there is a method for determining and utilizing an optimum approximating-function parameter (hereinafter referred to as "correction parameter") by performing regression analysis from the difference obtained in step S106. The first method is applicable when the deformation shapes of the ZX bar mirrors 50 and 53 over time are known. In such a case, the central portion of the ZX bar mirrors 50 and 53 depresses in the focus direction due to, for example, a self-weight deformation or a change in bonding portion, so that the entire ZX bar mirrors 50 and 53 are readily deformed in arcuate form. Since gradual deformation represented by arcuate deformation can be approximated by a relatively low-order nth order function, it is preferable that a correction parameter obtained by approximating the difference obtained in step S106 by the nth order function is determined and utilized. Even when the shapes of the ZX bar mirrors 50 and 53 are subject to deformation, which can be approximated by a high-order component, due to a change in environmental temperature, a correction parameter can be determined and utilized as in the foregoing by deriving an approximating-function from the difference. As the second correcting method for correcting a specific error between shapes in step S108, there is a method for creating and utilizing a bar mirror shape correction table (hereinafter referred to simply as "correction table") from a difference for each measurement point MP obtained in step S106. The correction table is prepared by the amount of parameter columns for each axis to be corrected.

Figure 8:
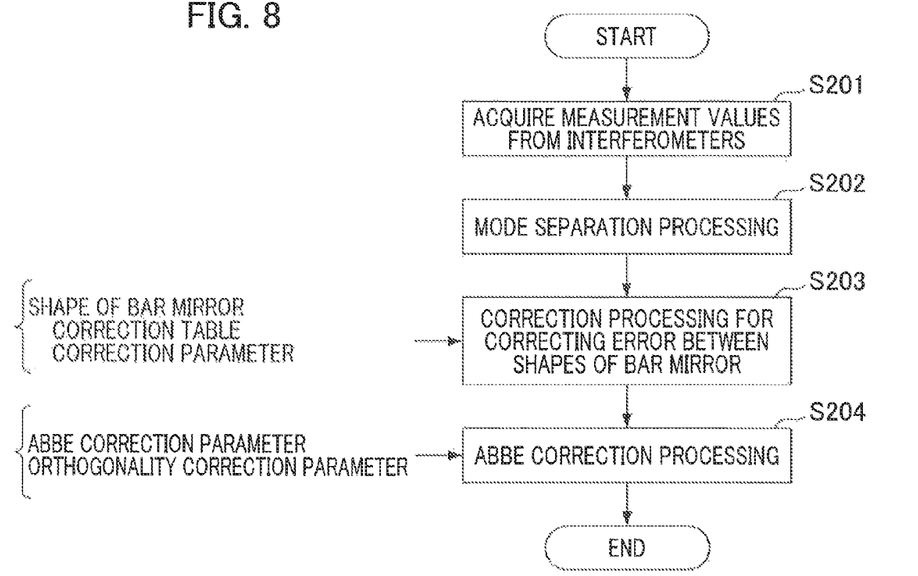
FIG. 8 is a flowchart illustrating a data processing step of processing measurement values obtained by the respective position measuring systems.

FIG. 8 is a flowchart illustrating data processing for measurement values obtained by the length measuring mechanism according to the present embodiment. Firstly, the controller 300 obtains measurement values from the interferometers 42, 43, 45, 46, 47, 48, and 51 included in the length measuring mechanism described with reference to FIG. 4 (step S201). The measurement values obtained herein are not orthogonal to each other as indicated by the abstract coordinate axes. Thus, the controller 300 executes processing (mode separation processing) for converting the measurement values obtained in step 3201 into orthogonal components (X-, Y-, Z-, ωx-, ωy-, and ωz-components) (step S202). Next, the controller 300 executes correction processing for correcting an error caused between shapes by a change in shape (flatness) of the bar mirror (the ZX bar mirrors 50 and 53) with respect to the measurement values subjected to mode separation (step S203). Here, the controller 300 corrects an error between shapes using the first and/or second correcting methods. More specifically, the controller 300 adds a correction parameter or a correction table to the measurement values subjected to mode separation. Next, the controller 300 executes Abbe correction processing for the measurement values subjected to error correction processing between shapes (step S204). Abbe correction is to functionally correct a low-order error component which may occur as a result of tilt of the measurement optical axis of the interferometers or attachment of the bar mirrors tilted with respect to a design value. More specifically, the controller 300 prepares an Abbe correction parameter or an orthogonality correction parameter in advance, and applies the parameter to measurement values subjected to error correction processing between shapes. Here, the measurement values subjected to Abbe correction processing indicate the current position of the bar mirror after correction in the focus (the Z-axis) direction. Thereafter, the controller 300 reflects the Z target value and the current position value after correction to an actual movement amount required for moving the wafer stage 6 to the target position. An error between shapes in the leveling (ωy) direction can also be corrected as in the method for correcting a focus component shown in FIG. 7, and the same control as that for a focus component is executed.

Figure 9:
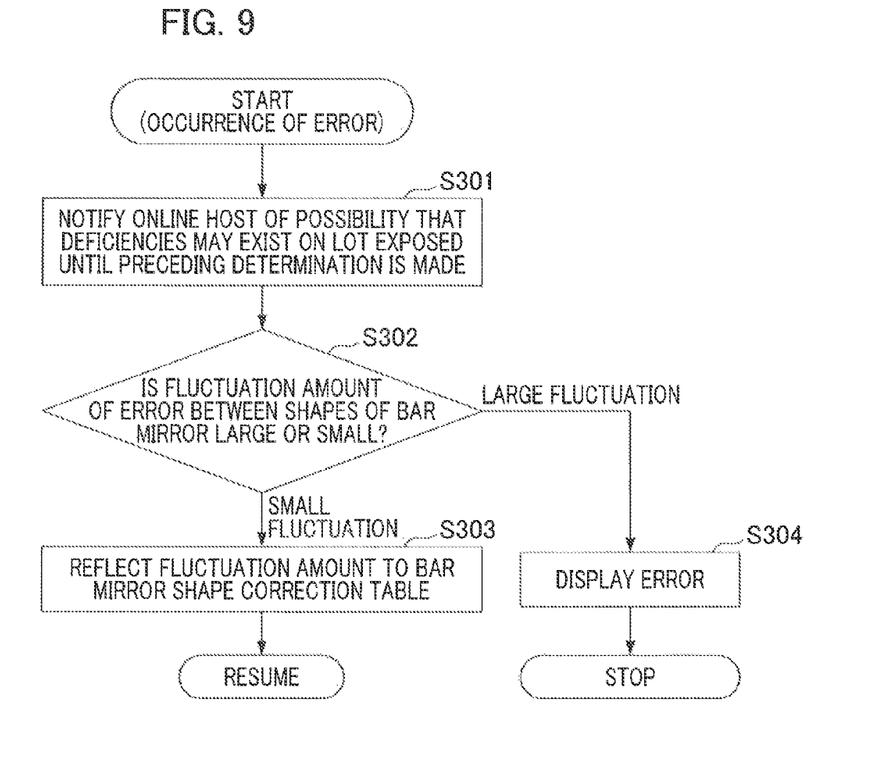
FIG. 9 is a flowchart illustrating an error processing step.

FIG. 9 is a flowchart illustrating a error processing step to be successively executed when the controller 300 determines that the difference does not fall within an allowable range of a change in shape over time (NO) in step S107 in FIG. 6. After occurrence of an error, the controller 300 firstly notifies an online host of the fact that deficiencies may exist on a lot(s) exposed between a time point at which it is determined in step S107 in the previous correcting step that the difference falls within an allowable range and a time point at which it is determined in step S107 in the current correcting step that the difference does not fall within an allowable range (step S301). Next, the controller 300 determines whether or not the fluctuation amount of the error between the shapes is large or small, that is, whether or not the fluctuation amount is recoverable by feedback correction for a correction table or the like with reference to the error table between shapes in which errors between the shapes of the ZX bar mirror are recorded (step S302). Here, when the controller 300 determines that the fluctuation amount is small and thus recoverable (small fluctuation), the process shifts to the following step S303. Then, the controller 300 performs correction (reflects the fluctuation amount) for the correction table, the Abbe correction parameter, the orthogonality correction parameter, and the like (step S303), and then starts exposure for the subsequent lot. On the other hand, when the controller 300 determines in step S302 that the fluctuation amount is large and thus is unrecoverable (large fluctuation), the controller 300 displays an error (the position of the bar mirror of the error source and the like) (step S304). Then, the controller 300 stops processing by notifying the online host of the error status and waits for a manual assist.

In the above description, when a difference between the shapes of the ZX bar mirrors 50 and 53 is measured, that is, when an error between shapes occurs, the measurement error is controllably corrected by using the correction table and the correction parameter. However, the present invention is not limited thereto, but the shapes of the ZX bar mirrors 50 and 53 may also be physically changed (directly deformed) by locally changing a temperature thereof. When variation occurs across the measurement values obtained by the first focus position measuring unit 5 or the second focus position measuring unit 21 and the variation is greater than tolerance, the focus position measuring units themselves may be defective. Likewise, deficiencies may also occur for the adjustment of air-conditioning environment in the stations 100 and 200. Even in such a case, the controller 300 may also generate (display) an error for notifying a fact so as to execute processing for blocking automatic reflection of the fluctuation amount of the error between the shapes due to an unintended cause.

Thus, the exposure apparatus 1 recognizes whether or not a relative error greater than a second order component occurs between the shapes of the ZX bar mirrors 50 and 53 due to a change over time during operation of the apparatus 1, and then reflects the relative error between the shapes to the current positions of the wafer stages 6 when an non-negligible error occurs between shapes. Conventionally, such non-negligible error between shapes has been corrected by verifying the measurement result obtained after the operation of the exposure apparatus is temporarily stopped after exposure of a process wafer or a wafer for focus performance inspection. In contrast, the exposure apparatus 1 can perform self measurement as a self authenticating function concurrently with a periodic maintenance or a process wafer job. Thus, the exposure apparatus 1 can efficiently correct an error between shapes while suppressing a reduction in throughput, so that the exposure apparatus 1 can efficiently correct the movement error which may adversely affect on the positioning precision of the wafer stages 6 in the focus and leveling directions.

As described above, according to the present embodiment, an exposure apparatus and an exposure method which are advantageous for suppressing a reduction in positioning precision of the wafer stage which is movable while holding a wafer may be provided.

While, in the above embodiment, a laser interferometer is used as a position measuring system (length measuring mechanism) for measuring the positions of the wafer stages 6, the positions of the wafer stages 6 may also be measured based on the relative distance therebetween using a two-dimensional encoder instead of a laser interferometer. In this case, a reference member is, for example, a scale having a plurality of slits, and the index of the correction table for one-dimensional ZX bar mirror in the above description needs to be extended in two dimensions.

In the above embodiment, a description has been given by taking an example of an exposure apparatus which projects an original pattern onto a substrate using a projection optical system as a lithography apparatus. However, the lithography apparatus is not limited thereto but may be a lithography apparatus that patterns a substrate using a charged particle beam such as an electron beam or may also be an imprint apparatus that molds an uncured resin (imprint material) on a substrate using a mold to thereby form a pattern on the substrate.

(Article Manufacturing Method)

A method for manufacturing an article (semiconductor integrated circuit element, liquid display element, recording medium, optical element, or the like) may include a step of patterning a substrate (wafer, glass plate, film-like substrate, or the like) using the lithography apparatus described above. Furthermore, the manufacturing method may include at least one of steps of developing and etching the substrate on which a pattern has been formed. The manufacturing method may include other processing (processing step) for processing the substrate on which a pattern has been formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-163734 filed on Aug. 7, 2013, which is hereby incorporated by reference herein in its entirety.

What is claimed is:

1. A lithography apparatus that patterns a substrate, the apparatus comprising:
   a substrate holder configured to hold the substrate and be movable;
   a measuring station that includes a first measuring device including a first reference member and configured to measure a height of the substrate holder via the first reference member, the measured height by the first measuring device being used to position the substrate holder relative to the measuring station, and a second measuring device configured to measure a height of a surface of the substrate held by the substrate holder;
   a patterning station that includes a third measuring device including a second reference member and configured to measure a height of the substrate holder via the second reference member, the measured height by the third measuring device being used to position the substrate holder relative to the patterning station, and patterns the substrate held by the substrate holder based on an output of the second measuring device; and
   a controller,
   wherein the patterning station includes a fourth measuring device configured to measure a height of the surface of the substrate held by the substrate holder, and the controller is configured to obtain a correction value for compensating for a difference between a shape of the first reference member and a shape of the second reference member and for correcting an output obtained from at least one of the first measuring device and the third measuring device based on an output of the second measuring device and an output of the fourth measuring device with respect to a substrate held by the substrate holder to compensate for the difference using the correction value to position the substrate holder.

2. The lithography apparatus according to claim 1, wherein the controller is configured to obtain the correction value based on a difference between the output of the second measuring device and the output of the fourth measuring device.

3. The lithography apparatus according to claim 1, wherein the controller is configured to obtain the correction value based on the output of the second measuring device and the output of the fourth measuring device with respect to the same target point in the surface of the substrate held by the substrate holder.

4. The lithography apparatus according to claim 1, wherein a plurality of the first measuring device and a plurality of the third measuring device are provided, and the controller is configured to obtain, as the correction value, a correction value for an output obtained from at least one of the plurality of the first measuring device and the plurality of the third measuring device.

5. The lithography apparatus according to claim 1, wherein the controller is configured to perform an output relating to an error based on the output of the second measuring device and the output of the fourth measuring device with respect to the substrate held by the substrate holder.

6. The lithography apparatus according to claim 1, wherein the second measuring device is configured to measure the height of the surface of the substrate held by the substrate holder relative to a reference plane provided on the substrate holder.

7. The lithography apparatus according to claim 1, wherein the patterning station includes a projection system for projecting a pattern of an original onto the substrate, and the fourth measuring device is configured to measure the height of the surface of the substrate held by the substrate holder relative to a reference plane provided on the substrate holder via the projection system.

8. The lithography apparatus according to claim 1, wherein each of the first reference member and the second reference member includes a mirror or a scale.

9. The lithography apparatus according to claim 1, wherein a plurality of the substrate holder is provided, and patterning of a first substrate by the patterning station and measuring of a second substrate by the measuring station are performed in parallel with each other.

10. A method of manufacturing an article, the method comprising:
   patterning a substrate using a lithography apparatus, and
   processing the patterned substrate to manufacture the article,
   wherein the lithography apparatus includes:
   a substrate holder configured to hold the substrate and be movable;
   a measuring station that includes a first measuring device including a first reference member and configured to measure a height of the substrate holder via the first reference member, the measured height by the first measuring device being used to position the substrate holder relative to the measuring station, and a second measuring device configured to measure a height of a surface of the substrate held by the substrate holder;
   a patterning station that includes a third measuring device including a second reference member and configured to measure a height of the substrate holder via the second reference member, the measured height by the third measuring device being used to position the substrate holder relative to the patterning station, and patterns the substrate held by the substrate holder based on an output of the second measuring device; and
   a controller,
   wherein the patterning station includes a fourth measuring device configured to measure a height of the surface of the substrate held by the substrate holder, and the controller is configured to obtain a correction value for compensating for a difference between a shape of the first reference member and a shape of the second reference member and for correcting an output obtained from at least one of the first measuring device and the third measuring device based on an output of the second measuring device and an output of the fourth measuring device with respect to a substrate held by the substrate holder to compensate for the difference using the correction value to position the substrate holder.

11. A lithography apparatus that patterns a substrate, the apparatus comprising:
   a substrate holder configured to hold the substrate and be movable;
   a measuring station that includes a first measuring device including a first reference member and configured to measure a height of the substrate holder via the first reference member, the measured height by the first measuring device being used to position the substrate holder relative to the measuring station, and a second measuring device configured to measure a height of a surface of the substrate held by the substrate holder;
   a patterning station that includes a third measuring device including a second reference member and configured to measure a height of the substrate holder via the second reference member, the measured height by the third measuring device being used to position the substrate holder relative to the patterning station, and patterns the substrate held by the substrate holder based on an output of the second measuring device; and
   a controller,
   wherein the patterning station includes a fourth measuring device configured to measure a height of a surface of a substrate held by the substrate holder, and the controller is configured to obtain a value for compensating for a difference between a shape of the first reference member and a shape of the second reference member based on an output of the second measuring device and an output of the fourth measuring device with respect to a substrate held by the substrate holder to compensate for the difference using the value to position the substrate holder.

12. A method of manufacturing an article, the method comprising:
   patterning a substrate using a lithography apparatus, and
   processing the patterned substrate to manufacture the article,
   wherein the lithography apparatus includes:
   a substrate holder configured to hold the substrate and be movable;
   a measuring station that includes a first measuring device including a first reference member and configured to measure a height of the substrate holder via the first reference member, the measured height by the first measuring device being used to position the substrate holder relative to the measuring station, and a second measuring device configured to measure a height of a surface of the substrate held by the substrate holder;
   a patterning station that includes a third measuring device including a second reference member and configured to measure a height of the substrate holder via the second reference member, the measured height by the third measuring device being used to position the substrate holder relative to the patterning station, and patterns the substrate held by the substrate holder based on an output of the second measuring device; and
   a controller,
   wherein the patterning station includes a fourth measuring device configured to measure a height of a surface of a substrate held by the substrate holder, and the controller is configured to obtain a value for compensating for a difference between a shape of the first reference member and a shape of the second reference member based on an output of the second measuring device and an output of the fourth measuring device with respect to a substrate held by the substrate holder to compensate for the difference using the value to position the substrate holder.

* * * * *